United States Patent
Choi (10) Patent No.: US 9,151,393 B2
(45) Date of Patent: Oct. 6, 2015

(54) TWO WAY GATE VALVE AND SUBSTRATE PROCESSING SYSTEM HAVING THE SAME

(71) Applicant: NEW POWER PLASMA CO., LTD., Gyeonggi-do (KR)

(72) Inventor: Dae-Kyu Choi, Gyeonggi-do (KR)

(73) Assignee: NEW POWER PLASMA CO., LTD., Gyeonggi-do (KR)

(*) Notice: Subject to any disclaimer, the term of this patent is extended or adjusted under 35 U.S.C. 154(b) by 134 days.

(21) Appl. No.: 13/716,881

(22) Filed: Dec. 17, 2012

(65) Prior Publication Data

US 2013/0153806 A1   Jun. 20, 2013

(30) Foreign Application Priority Data

Dec. 16, 2011   (KR) .................. 10-2011-0136860

(51) Int. Cl.
*F16K 25/00* (2006.01)
*F16K 3/00* (2006.01)
*H01L 21/67* (2006.01)

(52) U.S. Cl.
CPC ............ *F16K 3/00* (2013.01); *H01L 21/67126* (2013.01)

(58) Field of Classification Search
CPC .............. F16K 3/10; F16K 3/14; F16K 3/16; F16K 3/18; F16K 3/182; F16K 3/184; F16K 3/186

USPC ......... 251/167, 169, 195, 198, 199, 196, 197, 251/200, 201, 203, 204

See application file for complete search history.

(56) References Cited

U.S. PATENT DOCUMENTS

| | | | |
|---|---|---|---|
| 4,157,169 A * | 6/1979 | Norman ..................... | 251/195 |
| 6,561,484 B2 * | 5/2003 | Nakagawa et al. ........... | 251/175 |
| 6,564,818 B2 * | 5/2003 | Kroeker et al. .............. | 137/15.23 |
| 7,128,305 B2 * | 10/2006 | Tomasch ..................... | 251/211 |
| 7,494,107 B2 * | 2/2009 | Sheydayi et al. ............. | 251/63.5 |
| 2005/0092953 A1 * | 5/2005 | Hayashi et al. ............... | 251/167 |

* cited by examiner

*Primary Examiner* — John K Fristoe, Jr.
*Assistant Examiner* — Hailey K Do
(74) *Attorney, Agent, or Firm* — Rabin & Berdo P.C.

(57) ABSTRACT

A two way gate valve includes a valve chamber having a first entrance coupled with a first chamber, a second entrance coupled with a second chamber, and an openable and closable chamber cover; a moving module having a first sealing plate for sealing the first entrance, a second sealing plate for sealing the second entrance, and a moving module body to which the first and the second sealing plates are mounted; a push-pull module having a push-pull module body coupled with the moving module body such that the moving module body can linearly move, a first operating body for moving the moving module in a first entrance direction such that the first sealing plate seals the first entrance, and a second operating body for moving the moving module in a second entrance direction such that the second sealing plate seals the second entrance.

18 Claims, 7 Drawing Sheets

TWO WAY GATE VALVE AND SUBSTRATE PROCESSING SYSTEM HAVING THE SAME

CROSS-REFERENCE TO RELATED APPLICATION

This application claims priority of Korean patent application numbers 10-2011-0136860 filed on Dec. 16, 2011. The disclosure of each of the foregoing applications is incorporated herein by reference in its entirety.

BACKGROUND

1. Technical Field

The present invention relates to a gate valve used for a vacuum processing apparatus, and more particularly to a gate valve used for a substrate processing apparatus for processing a semiconductor substrate and a substrate processing system having the same.

2. Background Art

Generally, a semiconductor substrate is manufactured through several steps of vacuum processing processes. Various types of vacuum processing processes such as a deposition, an etching, and an ashing are performed in a process chamber having a vacuum state lower than a predetermined air pressure. A yield is one of very important elements in a semiconductor manufacturing process. In order to increase a yield in a semiconductor manufacturing process, a substrate processing system with various structures is used. For example, the substrate processing system includes an in-line type substrate processing system in which a plurality of process chambers are successively arranged and a cluster type substrate processing system in which a plurality of process chambers are radially arranged.

Figure 1:
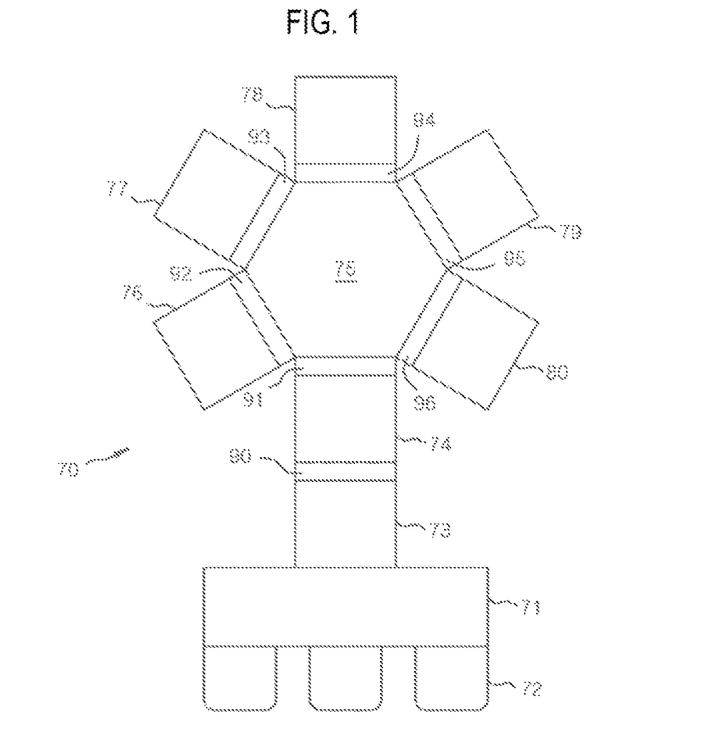
FIG. 1 illustrates an example of a conventional cluster type substrate processing system.

FIG. 1 is a view illustrating an example of a convention cluster type substrate processing system.

Referring to FIG. 1, a cluster type substrate processing system 70 includes a first transfer chamber 75 having a polygonal cross section structure. A plurality of process chambers 76, 77, 78, 79, and 80 and one loadlock chamber 74 are radially arranged to be coupled with the first transfer chamber 75. Each of gate valves 92, 93, 94, 95, and 96 is disposed between the first transfer chamber 75 and each of the plurality of process chambers 76, 77, 78, 79, and 80. Similarly, a gate valve 91 is disposed between the first transfer chamber 75 and the loadlock chamber 74. A second transfer chamber 73 is coupled with another surface of the loadlock chamber 74 and the gate valve 90 is disposed between the loadlock chamber 74 and the second transfer chamber 73. An EFEM (Equipment Front End Module) 71 equipped with a plurality of cassettes 72 is disposed in front of the second transfer chamber 73.

A transfer robot (not shown) operating in a vacuum state is installed in the first transfer chamber 75, and a transfer robot (not shown) operating in an atmospheric pressure state is installed in the second transfer chamber 73. The loadlock chamber 74 maintains an atmospheric pressure state while performing a substrate exchanging operation with the second transfer chamber 73, and maintains a vacuum state while performing a substrate exchanging operation with first transfer chamber 75. The first transfer chamber 75 maintains a vacuum state and performs a substrate exchanging operation with the plurality of chambers 74, 76, 77, 78, 79, and 80 connected to circumferences of the first transfer chamber 75.

Such a cluster type substrate processing system 70 has a structure, which can increase a yield by simultaneously processing a plurality of substrates to be processed through the plurality of process chambers 76, 77, 78, 79, and 80 radially arranged in the circumferences of the first transfer chamber 75. However, when one of the plurality of process chambers 76, 77, 78, 79, and 80 is broken, there is a disadvantage in that a broken chamber should be replaced or the substrate processing system 70 should be totally stopped in order to repair the broken chamber.

Meanwhile, in general, a substrate entrance provided between chambers is locked through the gate valve as described above. The gate valve uses a sealing member such as an O-ring. The sealing member corresponds to a consumable member and is replaced after using the sealing member during a certain period. However, when it is required to replace the sealing member, an operation of the substrate processing system should be stopped, so that it also causes a yield reduction. In a case of the in-line type substrate processing system, there exists the same problem as described above as well.

As described above, in a case where two chambers are coupled with each other through the gate valve, when it is necessary to stop an overall operation of the substrate processing system for maintenance of one of the chambers or to stop an overall operation of the substrate processing system for maintenance of the gate valve, a main problem causing a yield reduction occurs.

SUMMARY OF INVENTION

An object of the present invention is to provide a two way gate valve and a substrate processing system with the same in which maintenance of a chamber mounted to a substrate processing system is possible and maintenance of the gate valve is possible while not stopping an overall operation of the substrate processing system.

In order to attain the above object, one aspect according to the preferable embodiments of the present invention provides a two way gate valve including: a valve chamber having a first entrance coupled with a first chamber, a second entrance coupled with a second chamber, and an openable and closable chamber cover; a moving module having a first sealing plate for sealing the first entrance, a second sealing plate for sealing the second entrance, and a moving module body to which the first and the second sealing plates are mounted; a push-pull module having a push-pull module body coupled with the moving module body such that the moving module body can linearly move, a first operating body for moving the moving module in a first entrance direction such that the first sealing plate seals the first entrance, and a second operating body for moving the moving module in a second entrance direction such that the second sealing plate seals the second entrance; a first driving means for driving the first operating body; a second driving means for driving the second operating body; and a third driving means for moving the push-pull module between an operation position and a standby position, wherein, when the push-pull module is moved to the operation position by the third driving means, the first operating body is operated by the first driving means or the second operating body is operated by the second driving means, so that one of the first entrance and the second entrance is selectively sealed.

Preferably, according to an embodiment, the first operating body includes a rotating axis rotatably coupled with the push-pull module body and a push bar having a moving axis connected to the first driving means, and, when the first driving means moves the moving axis, the push bar pushes and moves the moving module in the first entrance direction while rotating on the rotating axis, so that the first sealing plate seals the first entrance.

According to an embodiment, the first driving means includes a first shaft coupled with the first operating body and a first cylinder for driving the first shaft, the second driving means includes a second shaft coupled with the second operating body and a second cylinder for driving the second shaft, and the third driving means includes a third shaft coupled with the push-pull module and a third cylinder for driving the third shaft.

According to an embodiment, the first to the third cylinders correspond to one of a hydraulically driven cylinder, a pneumatically driven cylinder, and a solenoid-driven cylinder.

According to an embodiment, the two way gate valve further including a bellows for vacuum-sealing the first to third driving means within the valve chamber.

According to an embodiment, the push-pull module includes an elastic member for returning the moving module body to an original position after the moving module body is operated by the first operating body or the second operating body.

According to an embodiment, the two way gate valve further including one or more rollers provided between the push-pull module and the moving module.

Another aspect according to the preferable embodiments of the present invention provides a substrate processing system including: a first chamber; a second chamber; a valve chamber having a first entrance coupled with the first chamber, a second entrance coupled with the second chamber, and an openable and closable chamber cover; a moving module having a first sealing plate for sealing the first entrance, a sealing plate for sealing the second entrance, and a moving module body to which the first and second sealing plates are mounted; a push-pull module having a push-pull module body coupled with the moving module body such that the moving module body can linearly move, a first operating body for moving the moving module in a first entrance direction such that the first sealing plate seals the first entrance, and a second operating body for moving the moving module in a second entrance direction such that the second sealing plate seals the second entrance; a first driving means for driving the first operating body; a second driving means for driving the second operating body; and a third driving means for moving the push-pull module between an operation position and a standby position, wherein, when the push-pull module is moved to the operation position by the third driving means, the first operating body is operated by the first driving means or the second operating body is operated by the second driving means, so that one of the first entrance and the second entrance is selectively sealed.

According to an embodiment, the first chamber corresponds to a transfer chamber having a transfer apparatus for transferring a substrate to be processed, and the second chamber corresponds to a process chamber for vacuum-processing a substrate to be processed.

According to an embodiment, the transfer chamber is one of an atmospheric pressure chamber and a vacuum chamber.

According to an embodiment, the first and second chambers are process chambers for vacuum-processing a substrate to be processed.

According to an embodiment, the first chamber corresponds to a transfer chamber having a transfer apparatus for transferring a substrate to be processed, and the second chamber corresponds to a loadlock chamber for exchanging a substrate to be processed.

According to the present invention, the two way gate valve and the substrate processing system with the same can selectively seal entrances connected to a normally operated chamber when one of a first chamber and a second chamber connected to both sides of the system is stopped for maintenance, so that it is possible to perform the maintenance through stopping only the chamber requiring the maintenance without stopping the normally operated chamber. Further, when an O-ring of a sealing plate is needed to be replaced, the present invention can selectively seal one entrance of both entrances, which can implement an o-ring exchange without the stop of an overall operation of equipment. Accordingly, the two way gate valve according to the present invention can improve a maintenance efficiency of the equipment and a total operating rate of the equipment, and thereby increase the yield of the system.

BRIEF DESCRIPTION OF DRAWINGS

The above and other aspects, features and advantages of the present invention will be more apparent from the following detailed description taken in conjunction with the accompanying drawings, in which.

DESCRIPTION OF EMBODIMENTS

Hereinafter, exemplary embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

Figure 2:
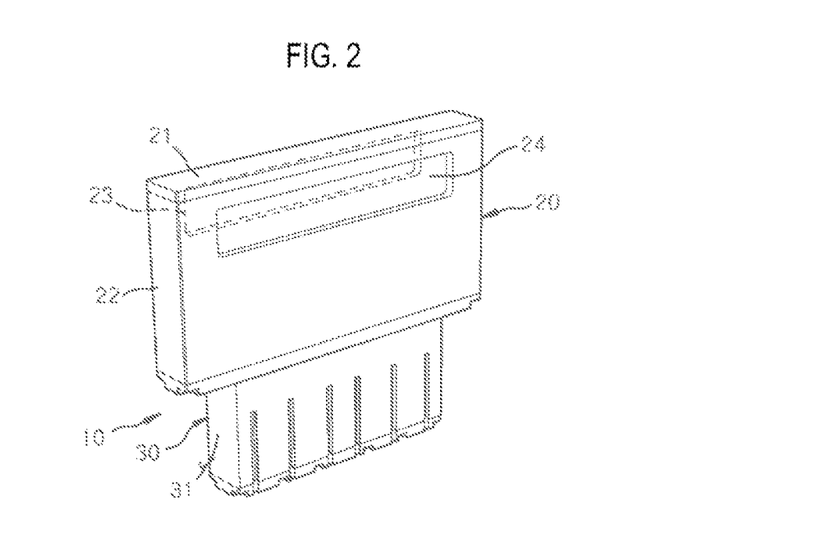
FIG. 2 is a perspective view of a two way gate valve according to exemplary embodiments of the present invention.

FIG. 2 is a perspective view of a two way gate valve according to exemplary embodiments of the present invention.

Referring to FIG. 2, a two way gate valve 10 according to exemplary embodiments of the present invention includes a valve chamber 20. The valve chamber 20 includes a valve chamber housing 22 having a first entrance 23 and a second entrance 24, and a valve chamber cover 21 openably and closably mounted to an upper part of the valve chamber housing 22. The valve chamber cover 21 is coupled with the valve chamber housing 22, and a sealing member such as an O-ring (not shown) is disposed between the valve chamber housing 22 and the valve chamber cover 21 such that the valve chamber housing 22 can be sealed. A driving member such as a cylinder module 30 for providing driving power for an operation of the two way gate valve 10 is connected to a lower part of the valve chamber housing 22. The cylinder module 30 includes a plurality of shafts and a cylinder module body 31 equipped with a cylinder for driving the shafts. The cylinder module body 31 is coupled with the valve chamber housing 22, and a sealing member such as an O-ring (not shown) is disposed between the cylinder module body 31 and the valve chamber housing 22 to seal the valve chamber housing 22.

Figure 3:
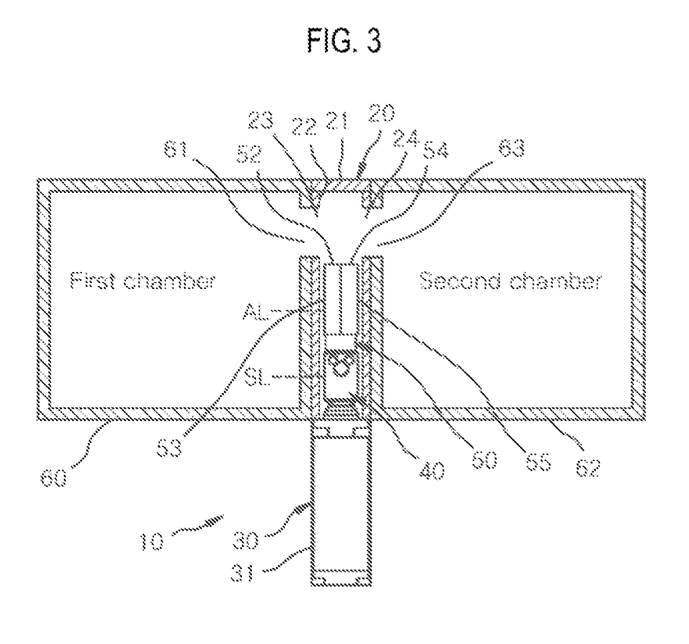
FIG. 3 is a cross-sectional view illustrating an example in which the two way gate value of FIG. 2 is installed between two chambers.
Figure 4:
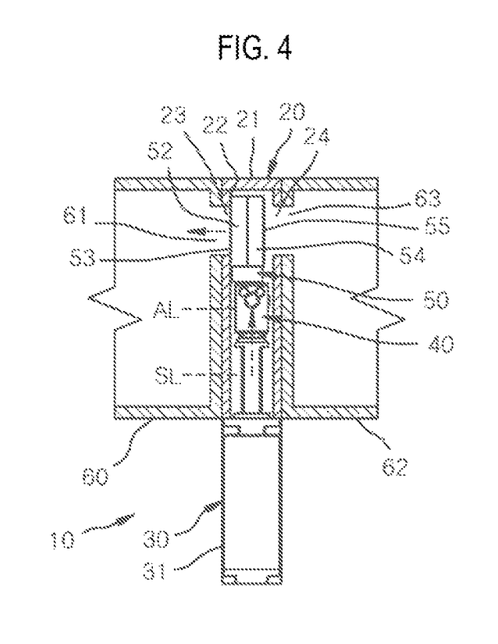
FIGS. 4 and 5 are views for describing an operation method of the two way gate valve.
Figure 5:
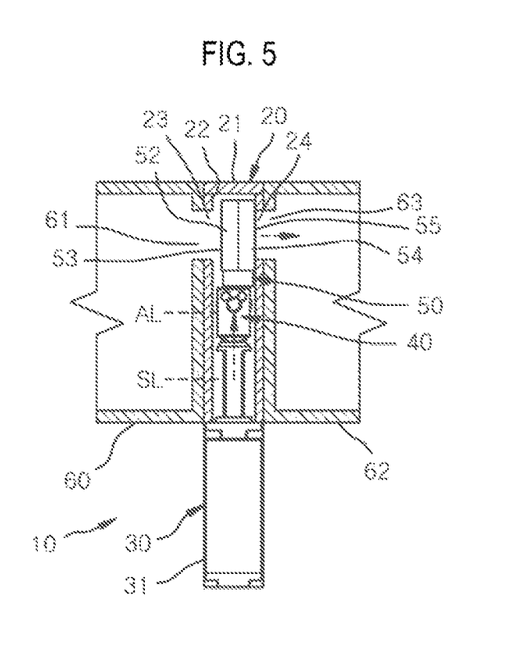

FIG. 3 is a cross-sectional view illustrating an example in which the two way gate valve of FIG. 2 is installed between two chambers, and FIGS. 4 and 5 are views for describing an operation method of the two way gate valve.

Referring to FIG. 3, the valve chamber 20 is installed between two chambers 60 and 62 to spatially connect or block the two chambers 60 and 62. The first entrance of the valve chamber 20 is connected to an entrance 61 of the first chamber 60 and the second entrance 24 of the valve chamber 20 is connected to an entrance 63 of the second chamber 62. A push-pull module 40 and a moving module 50 are installed within the valve chamber 20. A first sealing plate 52 for sealing the first entrance 23 and a second sealing plate 54 for sealing the second entrance 24 are installed in the moving module 50. The moving module 50 is vertically mounted to the push-pull module 40 such that the moving module 50 can linearly move. The push-pull module 40 is coupled with the cylinder module 30.

Figure 6:
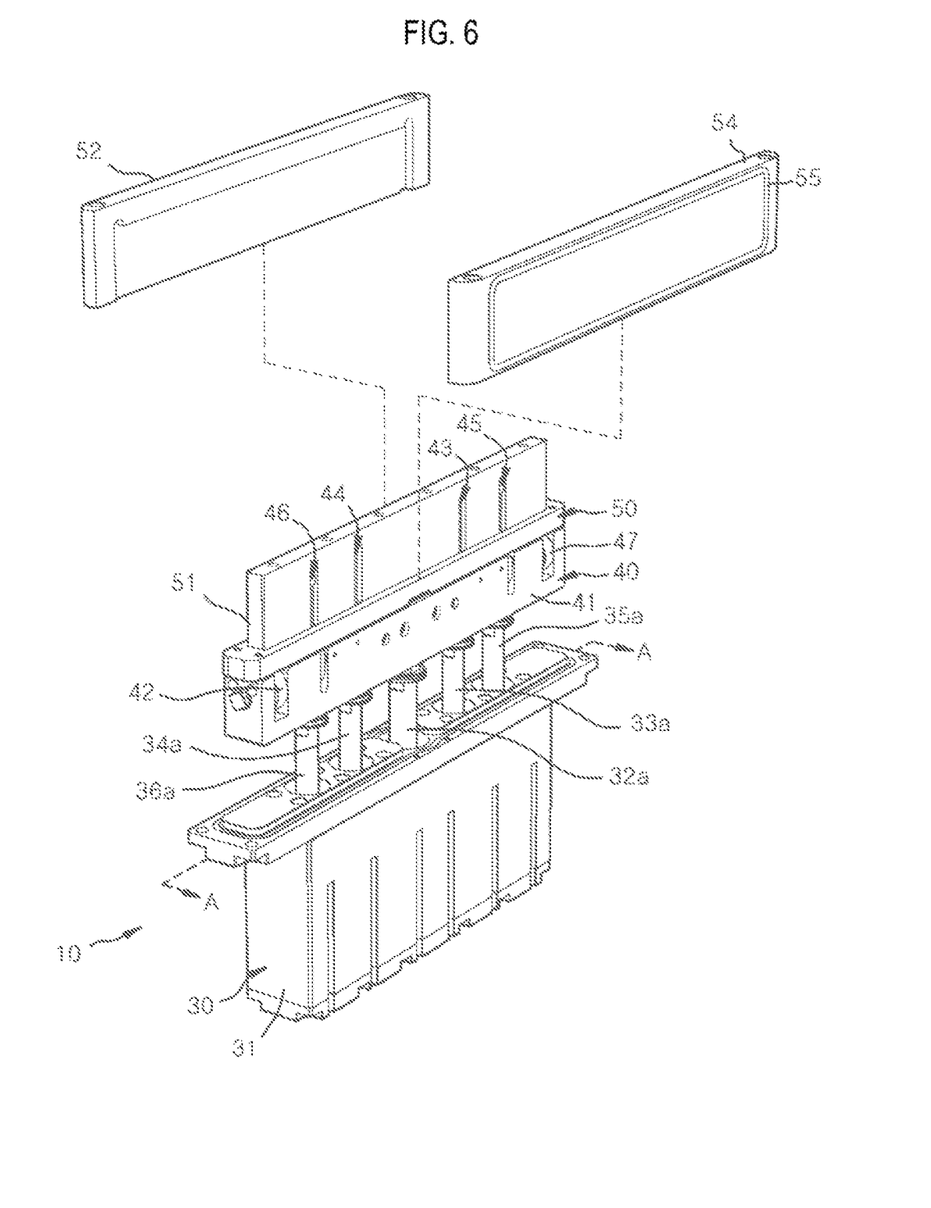
FIG. 6 is a perspective view illustrating a moving module and a push-pull module installed within a valve chamber.
Figure 7:
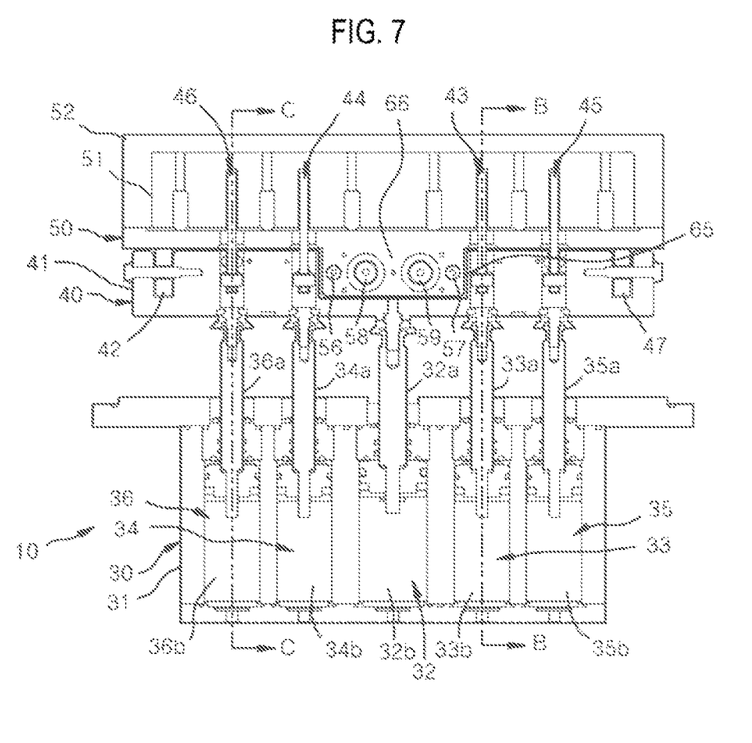
FIG. 7 is a cross-sectional view along with line A-A of FIG. 6.
Figure 8:
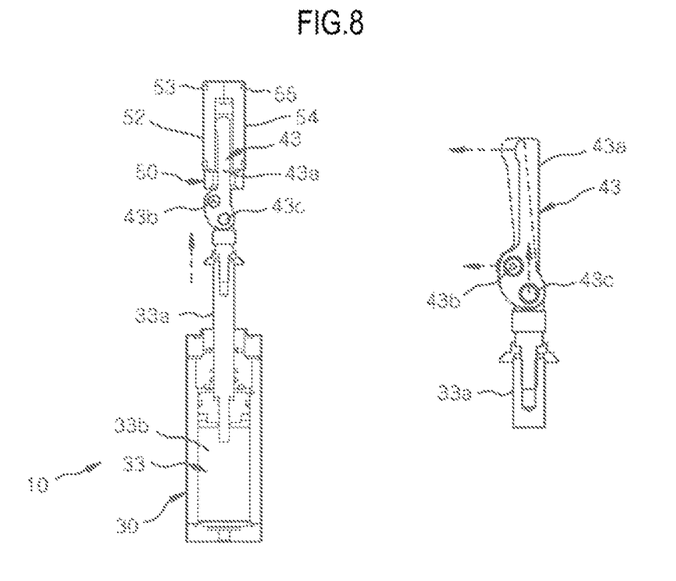
FIGS. 8 and 9 are cross-sectional views along with lines B-B and C-C of FIG. 7.
Figure 9:
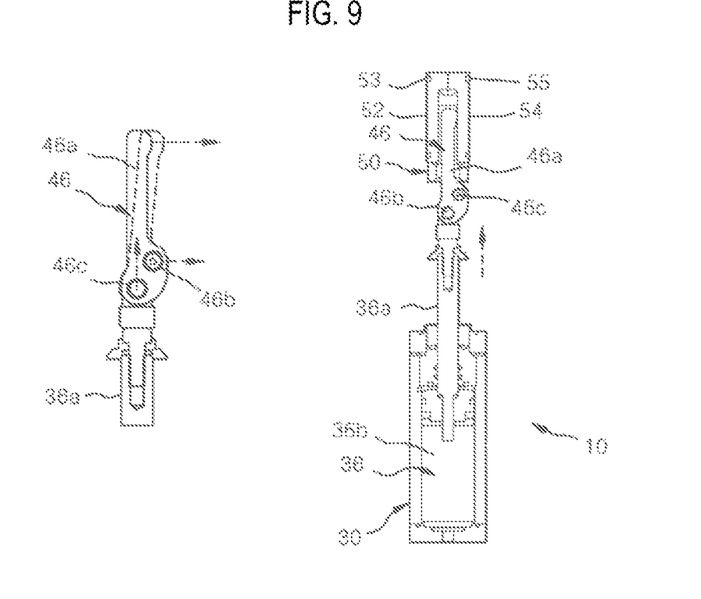

FIG. 6 is a perspective view illustrating a moving module and a push-pull module installed within a valve chamber, and FIG. 7 is a cross-sectional view along with line A-A of FIG. 6. Further, FIGS. 8 and 9 are cross-sectional views along with lines B-B and C-C of FIG. 7.

Referring to FIGS. 6 to 9, the moving module 50 is coupled with the push-pull module 40 such that the moving module 50 can linearly move in an upper part of the push-pull module 40 vertically. The moving module 50 includes a moving module body 51 equipped with the first and the second sealing plates 52 and 54. The first sealing plate 54 is mounted to one surface of the moving module body 51 facing the first entrance 23 and the second sealing plate 54 is mounted to another surface of the moving module body 52 facing the second entrance 24. The moving module 50 is operated to selectively seal the first entrance 23 and the second entrance 24 by the push-pull module 40.

The push-pull module 40 is installed above the cylinder module 30 and includes a push-pull module body 41 with which the moving module body 51 is coupled such that the moving module body 51 can linearly and vertically move. The push-pull module body 41 includes a pair of first operating bodies 43 and 44 and another pair of second operating bodies 45 and 46. The first operating bodies 43 and 44 move the moving module 50 in a direction of the first entrance to seal the first entrance 23. The second operating bodies 45 and 46 move the moving module 50 in a direction of the second entrance to seal the second entrance 24.

The cylinder module 30 includes a cylinder module body 31 equipped with a plurality of shafts 32a, 33a, 34a, 35a, and 36a as driving means providing driving power for operations of the moving module 50 and the push-pull module 40, and a plurality of cylinders 32b, 33b, 34b, 35b, and 36b for driving the shafts (shown in FIG. 7) arranged in parallel to the shafts. The shaft 32a and the cylinder 32b located in the center are connected to the push-pull module body 41 and correspond to a first driving means 32 for ascending and descending the push-pull module 50 between a standby position (SL) and an operation position (AL). A pair of cylinders 33b and 34b and a pair of shafts 33a and 34a located in inner side within the cylinder body 31 are connected to a pair of operating bodies 43 and 44 and correspond to a pair of second driving means 33 and 34. A pair of cylinders 35b and 36b and a pair of shafts 35a and 36a located in outer side within the cylinder body 31 are connected to a pair of second operating bodies 45 and 46 and correspond to a third driving means 35 and 36 for making the second sealing plate 54 have a push-pull movement.

The cylinder module 30 includes the plurality of cylinders 32b, 33b, 34b, 35b, and 36b integrally constructing one cylinder module body 31, but the cylinders can individually construct the cylinder module body 31. The plurality of cylinders 32b, 33b, 34b, 35b, and 36b may be implemented by a hydraulically driving method or a pneumatically driving method. Alternatively, the driving method may be changed to a solenoid-driving method. In the embodiment, the first to the third driving means are implemented by a shaft and a cylinder, but they may be changed to various types of other mechanical/electrical method.

Figure 11:
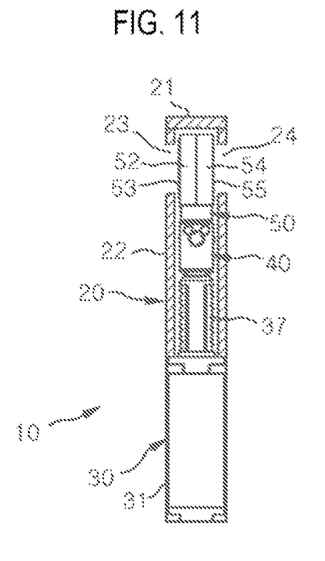
FIG. 11 is a view illustrating an example of using a bellows for the two way gate valve.

When the first to the third driving means 32, 33, 34, 35, 36 are implemented by a cylinder structure, an O-ring is used for sealing the cylinder, but the bellows 37 can be used for the sealing processing as shown in FIG. 11. Alternatively, both of the O-ring and the bellows can be used for the sealing processing.

As described above, the push-pull module 40 is located in a standby position (SL) of a lower end within the valve chamber 20, so that the two way gate valve 10 allows the first and the second entrances 23 and 24 to be in an open state. In order to seal the first and the second entrances 23 and 24, the push-pull module 40 is elevated to an operation position (AL). The elevation of the push-pull module 40 to the operation position (AL) is performed by simultaneous elevations of the plurality of shafts 32a, 33a, 34a, 35a, and 36a through simultaneous movements of the plurality of cylinders 32b, 33b, 34b, 35b, and 36b. That is, the cylinder 32b located in the center, a pair of cylinders 33b and 34b located in an inner side, and a pair of cylinders 35b and 36b located in an outer side within the cylinder module body 31 are simultaneously operated and then the push-pull module 40 is elevated to the operation position. When the elevation of the push-pull module 40 to the operation position (AL) is completed, the moving module 50 is moved in a direction of the first entrance 23 or in a direction of the second entrance 24, to selectively seal the first entrance 23 or the second entrance 24.

When the moving module 50 seals the first entrance 23, the cylinder 32b located in the center and the cylinders 35b and 36b located in the outer side are fixed without the elevation movement, and only the cylinders 33b and 34b located in the inner side elevate a little more. Then, as shown in FIG. 8, the first operating body 43 performs a push-movement for the moving module 50 in a direction of the first entrance 23. The moving module 50 moves forward in a direction of the first entrance through the push-movement of the first operating body 43, and then seals the first entrance 23.

More specifically, referring to FIG. 8, the first operating body 43 includes a rotating axis 43b rotatably coupled with the push-pull module body 41, and a push bar 43a having a moving axis 43c connected to the shaft 33a. When the cylinder elevates from the operation position (AL), pushing up forces are generated in the push bar 43a through the moving axis 43c connected to the shaft 33a. At this time, the push bar 43a moves forward while rotating on the rotating axis 43b by the pushing up forces. Then, the moving module 50 generally moves forward in a direction of the first entrance and the first sealing plate 52 seals the first entrance 23. A process of opening the first entrance 23 is implemented through an inverse process of the aforementioned sealing operation.

When the moving module 50 seals the second entrance 24, the cylinder 32b located in the center and the cylinders 33b and 34b located in the inner side are fixed without the elevation movement, and only the cylinders 35b and 36b located in the outer side elevate a little more. Then, as shown in FIG. 9, the second operating body 46 performs a push-movement for the moving module 50 in a direction of the second entrance 24. The moving module 50 moves forward in a direction of the second entrance through the push-movement of the second operating body 46, and then seals the second entrance 24.

More specifically, referring to FIG. 9, the second operating body 46 includes a rotating axis 46b rotatably coupled with the push-pull module body 41, and a push bar 43a having a moving axis 46c connected to the shaft 36a. When the cylinder elevates from the operation position (AL), pushing up forces are generated in the push bar 46a through the moving axis 46c connected to the shaft 36a. At this time, the push bar 46a moves forward while rotating on a rotating axis 46b by the pushing up forces. Then, the moving module 50 generally moves forward in a direction of the second entrance and the second sealing plate 54 seals the second entrance 24. A process of opening the second entrance 24 is implemented through an inverse process of the aforementioned sealing operation.

Referring back to FIGS. 6 and 7, one or more rollers 42 and 47 may be formed between the moving module 50 and the push-pull module 40 in order to reduce frictions with the push-pull module 40 and enable a flexible movement when the moving module 50 moves. For example, two rollers 42 and 47 are rotatably installed in both sides of the push-pull module body 41. Accordingly, the moving module body 51 is disposed on the push-pull module body 41 to have a predetermined gap.

An accommodation part 65 having an opening in an upper part of the accommodation part 35 is provided in the center of the push-pull module body 40, and a coupling part 66 inserted in the accommodation part 65 is provided in a center lower part of the push-pull module body 40. The coupling part 66 is coupled with a linearly moving axis 58 and 59 and accordingly, the moving module body 51 moves along with the linearly moving axis 58 and 59. A plurality of elastic members 56 and 57 such as coil springs are provided in the accommodation part 65. The elastic members 56 and 57 enable the moving module body 51 to be operated by the first operating bodies 43 and 44 or the second operating bodies 45 and 46 and then enable the moving module body 51 to be returned to an original position.

Figure 10:
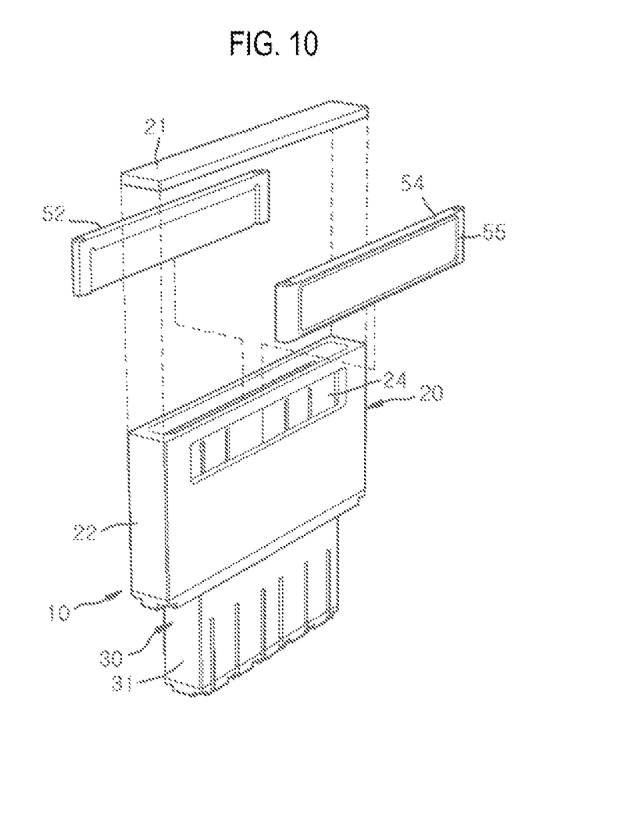
FIG. 10 is a view for describing a method of replacing a first or a second sealing plate.

FIG. 10 is a view for describing a method of replacing a first or a second sealing plate.

Referring to FIG. 10, as described above, the two way gate valve 10 according to the present invention can selectively seal one of the first or the second entrance 23 or 24. Accordingly, the second sealing plate 24 is replaced by opening the valve chamber cover 21 in a state where the first entrance 23 is sealed and the first sealing plate 23 is replaced by opening the valve chamber cover 21 in a state where the second entrance 24 is sealed.

In general, an O-ring used for the sealing plate of the gate valve corresponds to consumables which should be periodically replaced. Accordingly, an overall operation of equipment should be periodically stopped to replace the O-ring used for the sealing plate. However, the two way gate valve 10 according to the present invention can replace O-rings 53 and 54 used for the first or the second sealing plate 52 or 54 without stopping the overall operation of the equipment. For example, when the O-ring installed in the first sealing plate 52 is required to be replaced, the second sealing plate 54 is operated to seal the second entrance 24 (refer to FIG. 5), the valve chamber cover 21 is opened, the first sealing plate 52 is separated, and then the O-ring 53 may be replaced. Of course, in this case, only the chamber 60 connected to the first entrance 23 is partially stopped. Therefore, as described above, the present invention does not highly deteriorate the total yield of equipment because the O-ring replacing process may be implemented based on a fact that the total equipment having the two way gate valve 10 is not stopped but only a chamber, which required to be replaced, is partially stopped in the processing of replacing the O-rings 53 and 54.

The two way gate valve 10 according to the present invention may be helpfully used in a case where the maintenance of a chamber included in the equipment is needed. For example, when an operation is stopped for the maintenance of the first chamber 60, the second sealing plate 54 is operated to seal the second entrance 24 (refer to FIG. 5) and then the maintenance only for the first chamber 60 is performed. Alternatively, when an operation is stopped for the maintenance of the second chamber 62, the first sealing plate 52 is operated to seal the first entrance 23 (refer to FIG. 4) and then the maintenance only for the second chamber 62 is performed. As described above, when one of the first and the second chambers 60 and 62 connected to both sides of the two way gate valve 10 is stopped for the maintenance, the other chamber can be continuously operated. The two way gate valve 10 is disposed between the first and the second chambers 60 and 62.

The aforementioned two way gate valve 10 according to the present invention can be usefully used in various types of substrate processing systems such as a cluster type substrate processing system or an in-line type substrate processing system. For example, the two way gate value may be constructed between a vacuum transfer chamber and a plurality of process chamber for a vacuum processing. Alternatively, it may be constructed between a transfer chamber of an atmospheric pressure and the process chamber for a vacuum processing. Alternatively, it may be constructed between the vacuum transfer chamber and a loadlock chamber. As described above, the two way gate valve 10 according to the present invention may be used for various substrate processing equipment. At this time, when a chamber requiring partial maintenance is found among many chambers included in the substrate processing system, the maintenance may be implemented in such a manner that an overall substrate processing system is not stopped but only the chamber requiring the maintenance is partially stopped.

Although embodiments of the two way gate valve according to the present invention and the substrate processing system with the same have been described for illustrative purposes, those skilled in the art will appreciate that various modifications, additions and substitutions are possible, without departing from the scope and spirit of the invention as disclosed in the accompanying claims. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. A two way gate valve comprising:
    a valve chamber having
        a first entrance coupled with a first chamber, a second entrance coupled with a second chamber, and an openable and closable chamber cover;
a moving module including
a first sealing plate for sealing the first entrance,
a second sealing plate for sealing the second entrance, and
a moving module body to which the first and the second sealing plates are mounted;
a push-pull module including
a push-pull module body coupled with the moving module body such that the moving module body can linearly move,
a first operating body disposed inside the push-pull module body and directly contacting the first sealing plate to move the first sealing plate in a first entrance direction such that the first sealing plate seals the first entrance, and
a second operating body disposed inside the push-pull module body and directly contacting the second sealing plate to move the second sealing plate in a second entrance direction such that the second sealing plate seals the second entrance,
wherein the first operating body and the second operating body are disposed in a row along the push-pull module body;
a first driving unit, coupled with the first operating body, to drive the first operating body;
a second driving unit, coupled with the second operating body, to drive the second operating body; and
a third driving unit moving the push-pull module between an operation position and a standby position,
wherein the first, second and third driving units are arranged in the row and the third driving unit is disposed in a middle of the row, and
wherein, when the push-pull module is moved to the operation position by the third driving unit, the first operating body is operated by the first driving unit and the second operating body is operated by the second driving unit, so that one of the first entrance and the second entrance is selectively sealed.

2. The two way gate valve according to claim 1, wherein the first operating body comprises a push bar having
a rotating axis rotatably coupled with the push-pull module body, and
a moving axis connected to the first driving unit,
wherein when the first driving unit moves the moving axis, the push bar directly pushes and moves the module first sealing plate in the first entrance direction while rotating on the rotating axis, so that the first sealing plate seals the first entrance.

3. The two way gate valve according to claim 1, further comprising a bellows for vacuum-sealing the first to third driving units within the valve chamber.

4. The two way gate valve according to claim 1, wherein the push-pull module comprises an elastic member for returning the moving module body to an original position after the moving module body is operated by the first operating body or the second operating body.

5. The two way gate valve according to claim 1, further comprising one or more rollers provided between the push-pull module and the moving module.

6. The two way gate valve according to claim 1, wherein the first driving unit comprises
a first shaft coupled with the first operating body, and
a first cylinder for driving the first shaft,
the second driving unit comprises
a second shaft coupled with the second operating body, and
a second cylinder for driving the second shaft, and
the third driving unit comprises
a third shaft coupled with the push-pull module, and
a third cylinder for driving the third shaft.

7. The two way gate valve according to claim 6, wherein the first to the third cylinders correspond to one of a hydraulically driven cylinder, a pneumatically driven cylinder, and a solenoid-driven cylinder.

8. A substrate processing system comprising:
a first chamber;
a second chamber;
a valve chamber having
a first entrance coupled with the first chamber,
a second entrance coupled with the second chamber, and
an openable and closable chamber cover;
a moving module including
a first sealing plate for sealing the first entrance,
a sealing plate for sealing the second entrance, and
a moving module body to which the first and second sealing plates are mounted;
a push-pull module including
a push-pull module body coupled with the moving module body such that the moving module body can linearly move,
a first operating body disposed inside the push-pull module body and directly contacting the first sealing plate to move the first sealing plate in a first entrance direction such that the first sealing plate seals the first entrance, and
a second operating body disposed inside the push-pull module body and directly contacting the second sealing plate to move the second sealing plate in a second entrance direction such that the second sealing plate seals the second entrance, wherein the first operating body and the second operating body are disposed in a row along the push-pull module body;
a first driving unit, coupled with the first operating body, to drive the first operating body;
a second driving unit, coupled with the second operating body, to drive the second operating body; and
a third driving unit moving the push-pull module between an operation position and a standby position,
wherein the first, second and third driving units are arranged in the row and the third driving unit is disposed in a middle of the row, and
wherein, when the push-pull module is moved to the operation position by the third driving unit, the first operating body is operated by the first driving unit or the second operating body is operated by the second driving unit, so that one of the first entrance and the second entrance is selectively sealed.

9. The substrate processing system according to claim 8, wherein the first and second chambers are process chambers for vacuum-processing a substrate to be processed.

10. The substrate processing system according to claim 8, wherein the first chamber corresponds to a transfer chamber having a transfer apparatus for transferring a substrate to be processed, and the second chamber corresponds to a loadlock chamber for exchanging a substrate to be processed.

11. The substrate processing system according to claim 8, wherein the first operating body comprises a push bar having
a rotating axis rotatably coupled with the push-pull module body, and
a moving axis connected to the first driving unit,
wherein when the first driving unit moves the moving axis, the push bar directly pushes and moves the first sealing plate in the first entrance direction while rotating on the rotating axis, so that the first sealing plate seals the first entrance.

12. The substrate processing system according to claim 8, wherein the first driving unit comprises
a first shaft coupled with the first operating body, and
a first cylinder for driving the first shaft,
the second driving unit comprises
a second shaft coupled with the second operating body, and
a second cylinder for driving the second shaft, and
the third driving unit comprises
a third shaft coupled with the push-pull module, and
a third cylinder for driving the third shaft.

13. The substrate processing system according to claim 8, wherein the first to the third cylinders correspond to one of a hydraulically driven cylinder, a pneumatically driven cylinder, and a solenoid-driven cylinder.

14. The substrate processing system according to claim 8, further comprising a bellows for vacuum-sealing the first to third driving units within the valve chamber.

15. The substrate processing system according to claim 8, wherein the push-pull module comprises an elastic member for returning the moving module body to an original position after the moving module body is operated by the first operating body or the second operating body.

16. The substrate processing system according to claim 8, further comprising one or more rollers provided between the push-pull module and the moving module.

17. The substrate processing system according to claim 8, wherein the first chamber corresponds to a transfer chamber having a transfer apparatus for transferring a substrate to be processed, and the second chamber corresponds to a process chamber for vacuum-processing a substrate to be processed.

18. The substrate processing system according to claim 17, wherein the transfer chamber corresponds to one of an atmospheric pressure chamber and a vacuum chamber.

* * * * *